United States Patent
Sung et al.

(10) Patent No.: US 12,268,102 B2
(45) Date of Patent: Apr. 1, 2025

(54) HORN SHAPED SPACER FOR MEMORY DEVICES

(71) Applicant: Taiwan Semiconductor Manufacturing Company, Ltd., Hsinchu (TW)

(72) Inventors: Fu-Ting Sung, Yangmei (TW); Huachun Liu, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 397 days.

(21) Appl. No.: 17/751,002

(22) Filed: May 23, 2022

(65) Prior Publication Data
US 2023/0380309 A1    Nov. 23, 2023

(51) Int. Cl.
*H10N 70/00*   (2023.01)
*H10N 70/20*   (2023.01)

(52) U.S. Cl.
CPC ......... *H10N 70/841* (2023.02); *H10N 70/011* (2023.02); *H10N 70/24* (2023.02); *H10N 70/826* (2023.02)

(58) Field of Classification Search
CPC .... H10N 70/841; H10N 70/011; H10N 70/24; H10N 70/826; H10N 70/8833; H10N 70/063; H10B 63/30
See application file for complete search history.

(56) References Cited

U.S. PATENT DOCUMENTS 9,818,935 B2 * 11/2017 Chuang ................. H10N 50/01
10,510,952 B2 * 12/2019 Sung ..................... H10N 50/01

* cited by examiner

*Primary Examiner* — Allison Bernstein
(74) *Attorney, Agent, or Firm* — Eschweiler & Potashnik, LLC

(57) ABSTRACT

The present disclosure relates to a memory device that includes a bottom electrode, a data storage structure overlying the bottom electrode, a top electrode overlying the data storage structure, a mask overlying the top electrode, and a sidewall spacer extending alongside the data storage structure and alongside the mask. The sidewall spacer extends to a height above an upper surface of the mask. A top electrode via (TEVA) extends through the mask to the top electrode and extends into the sidewall spacer, where a first curved portion of the sidewall spacer extends along a top surface of the mask and is spaced apart from the TEVA.

20 Claims, 10 Drawing Sheets

HORN SHAPED SPACER FOR MEMORY DEVICES

BACKGROUND

Many modern day electronic devices contain electronic memory configured to store data. Electronic memory may be volatile memory or non-volatile memory. Volatile memory stores data when it is powered, while non-volatile memory is able to store data when power is removed. Some promising candidates for next generation memory include Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
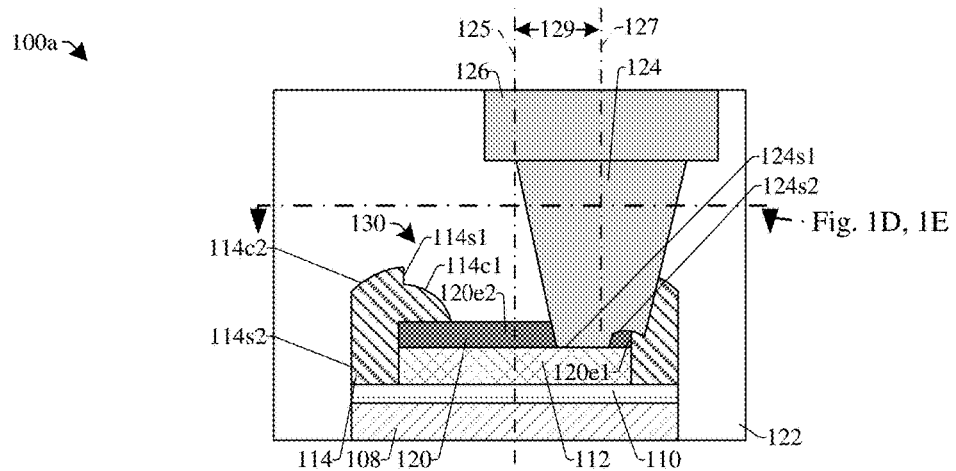
FIG. 1A illustrates a cross-sectional view of some embodiments of a memory device with a horn shaped sidewall spacer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices are configured to store data by switching between electrical states, for example, between a first data state (e.g., a "0") and a second data state (e.g., a "1"). Memory devices are fabricated with wires and vias that electrically couple to electrodes of the memory device to switch between the electrical state. During fabrication, integrated circuits are manufactured by building successive patterned layers on top of one another. Registration errors can occur where an upper layer is misaligned (e.g., rotated and/or laterally offset) relative to an underlying layer, and can result in wires and vias that are offset from a memory device. Thus, registration errors can result in read/write errors and shorting issues within the memory device.

For example, a memory device can have a bottom electrode separated from a top electrode by a data storage structure. The data storage structure can be a dielectric or a ferroelectric material depending on the memory device type. In some embodiments the memory device is a resistive random access memory (RRAM) device or a ferroelectric random access memory (FeRAM) device. A mask can cover the top electrode and a top electrode via (TEVA) can extend through the mask and electrically couple to the top electrode to operate the memory device. However, the TEVA can be formed with an overlay shift or registration error such that the TEVA extends past the top electrode and electrically couples to the top electrode to the bottom electrode, thus shorting the memory device.

Various aspects of the present disclosure relate to a memory device with a sidewall spacer, that when etched in the presence of a registration error for a TEVA opening, separates the TEVA opening, and a TEVA formed in the TEVA opening, from the bottom electrode. In some embodiments, a second hard mask layer is separated from the mask by a first hard mask layer. The first and second hard mask layers comprise differing etch rates where an etch rate of the first hard mask layer is faster than an etch rate of the second hard mask layer. As a result of the differing etch rates, when the first and second hard masks are etched to form respective first and second hard mask structures, a width of the first hard mask structure is less than a width of the second hard mask structure. As such, outer portions of the mask are exposed. A sidewall spacer is deposited over the first and second hard mask structures, the hard mask, and top electrode, including the outer portions of the mask.

The sidewall spacer is etched and the first and second hard mask structures are removed by a wet etch process exposing a middle portion of the mask. Outer portions of the mask are covered by the sidewall spacer, and the sidewall spacer forms a horn shape over the mask. A TEVA opening is formed through the mask to expose the top electrode. In some embodiments, the TEVA opening is formed with a registration error, where the TEVA opening extends past sidewalls of at least one of the mask or top electrode in the sidewall spacer. Due to the etch rates of the hard mask and the sidewall spacer adjacent to and partially covering the mask, the TEVA opening offset from the top electrode has a depth that terminates above a bottom surface of the top electrode within the sidewall spacer. Subsequently, a TEVA is formed within the TEVA opening electrically coupled to the top electrode and electrically isolated from the bottom electrode by the sidewall spacer. By forming the sidewall spacer covering outer portions of the mask, the TEVA is formed isolated from the bottom electrode when a registration error occurs, thereby preventing shorting of the memory device and improving reliability of read/write operations of the memory device.

FIG. 1A illustrates a cross-sectional view 100a of some embodiments of memory device 130 with a sidewall spacer 114 that is horn shaped.

Cross-sectional view 100a shows a memory device 130 disposed in an upper dielectric structure 122 where the memory device 130 includes a bottom electrode 108, a data storage structure 110, and a top electrode 112. In some embodiments, the memory device 130 is used for data storage, and can be a RRAM device, a FeRAM device, a magnetic random access memory (MRAM) device, a flash memory device, a phase-change memory (PCM) device, or the like. In embodiments where memory device 130 is the RRAM device, the data storage structure 110 can comprise one or more doped layers and is configured to store a data state by undergoing a reversible change between a high resistive state associated with a first data state (e.g., a '0') and a low resistive state associated with a second data state (e.g., a '1'). For example, to achieve a low resistive state within the data storage structure 110, a first set of bias conditions may be applied to the bottom electrode 108 and the top electrode 112. The first set of bias conditions may drive oxygen from the data storage structure 110 to the top electrode 112, thereby forming a conductive filament of oxygen vacancies across the data storage structure 110. Alternatively, to achieve a high resistive state within the data storage structure 110, a second set of bias conditions may be applied to the bottom electrode 108 and the top electrode 112. The second set of bias conditions may break the conductive filament by driving oxygen from the top electrode 112 to the data storage structure 110.

In various embodiments, the data storage structure 110, may comprise hafnium oxide, zirconium oxide, aluminum oxide, tantalum oxide, hafnium aluminum oxide, hafnium zirconium oxide, or the like. In various embodiments, when the data storage structure 110 is doped, the dopants may comprise nitrogen, fluorine, carbon, phosphorous, or the like. In some embodiments, the top electrode 112 and bottom electrode 108 is or comprises titanium nitride, platinum, aluminum copper, gold, titanium, tantalum, tantalum nitride, tungsten, tungsten nitride, or alloys or combinations of the foregoing. In some embodiments, the upper dielectric structure 122 is or comprises silicon dioxide (e.g., $SiO_2$), doped silicon dioxide (e.g., carbon doped silicon dioxide), silicon oxynitride (e.g., $N_2OSi_2$), borosilicate glass (BSG), phosphoric silicate glass (PSG), borophosphosilicate glass (BPSG), fluorinated silicate glass (FSG), or the like.

The bottom electrode 108 extends from a bottom surface of the upper dielectric structure 122, the data storage structure 110 is disposed on the bottom electrode 108 where the bottom electrode 108 and data storage structure 110 have substantially vertical sidewalls at a substantially common width. The top electrode 112 is disposed on the data storage structure 110 and the mask 120 is disposed on the top electrode 112 where the top electrode 112 and the mask 120 have substantially vertical sidewalls at a substantially common width that is less than the substantially common width of the bottom electrode 108 and data storage structure 110. The top electrode 112 and mask 120 are aligned with a center of the bottom electrode 108, and the bottom electrode 108 and data storage structure 110 extend past outer edges of the top electrode 112 and mask 120.

A sidewall spacer 114 extends from a top surface of the data storage structure 110. An upper metal feature 126 and a top electrode via (TEVA) 124 overly the memory device 130. The upper metal feature 126 and the TEVA 124 have a central axis 127 that is aligned offset with respect to a central axis 125 of the memory device 130 (see offset distance 129). The upper metal feature 126 may, for example, be a wire, a pad, or the like. In some embodiments, the upper metal feature 126 and the TEVA 124 are or comprise copper, tungsten, aluminum, some other suitable material(s), or any combination of the foregoing. The TEVA 124 extends from the upper metal feature 126, through the upper dielectric structure 122, the sidewall spacer 114, and the mask 120, to couple to the top electrode 112. The sidewall spacer 114 extends along outer sidewalls of the top electrode 112 and mask 120, and further extends along a bottom surface and outer sidewall of the TEVA 124. Outer edges of the sidewall spacer 114 are substantially aligned with outer edges of the data storage structure 110 and bottom electrode 108.

In some embodiments, the sidewall spacer 114 may comprise the same material as the mask 120. For example, in some embodiments the sidewall spacer 114 and the mask 120 may comprise a carbide (e.g., silicon carbide), a nitride (e.g., silicon nitride), an oxide (e.g., silicon oxy-nitride), or the like. In other embodiments, the sidewall spacer 114 may comprise a different material than the mask 120.

The TEVA 124 has a first lower surface 124s1 that extends through the mask 120 to the top electrode 112. The first lower surface 124s1 extends to a second lower surface 124s2 that extends above the first lower surface 124s1 and along an upper surface of the mask and further extends across sidewalls of the mask and top electrode and into the sidewall spacer 114. The first lower surface 124s1 and the second lower surface 124s2 can be referred to collectively as a lower surface of the TEVA 124 or a bottom surface of the TEVA 124. The bottom surface of the TEVA 124 is aligned between innermost edges of the sidewall spacer 114. A lowermost edge of the TEVA 124 disposed in the sidewall spacer 114 is above a bottom surface of the mask 120. The sidewall spacer 114 includes a first curved portion 114c1 extending along a top surface of the mask. The second lower surface 124s2 of the TEVA 124 is defined by a curved surface, and extends from a top surface of the top electrode 112 in a direction away from the first curved portion 114c1 of the sidewall spacer 114. In some embodiments, the second lower surface 124s2 is defined by a non-straight surface. The TEVA 124 separates a first edge portion 120e1 of the mask 120 from a second edge portion 120e2 of the mask 120. The first edge portion 120e1 portion of the mask 120 is below a top surface of the second edge portion 120e2 of the mask 120.

A second curved portion 114c2 of the sidewall spacer 114 extends from an outer edge of the data storage structure 110 to past an outer edge of the top electrode 112. The first curved portion 114c1 is separated from the second curved portion 114c2 by a first substantially vertical portion 114s1 of the sidewall spacer 114. As such, the second curved portion 114c2 and the first substantially vertical portion 114s1 of the sidewall spacer 114 overlie the mask. In some embodiments, the first substantially vertical portion 114s1 is laterally offset from the outer sidewall of mask 120 in a direction of the TEVA 124. A second substantially vertical portion 114s2 of the sidewall spacer 114 extends from the second curved portion 114c2 of the sidewall spacer 114 above the mask 120 to the data storage structure 110.

The portions of the sidewall spacer 114 define a horn shape that enhances reliability of the memory device 130. By forming the second substantially vertical portion 114s2 of the sidewall spacer 114 to extend above the mask 120, an etch rate through the sidewall spacer 114 will prevents the TEVA 124 from extending past the top electrode 112 and shorting to the bottom electrode 108 in the presence of a registration error. By forming the first curved portion 114c1 and second curved portion 114c2 of the sidewall spacer 114 to overlap with the top electrode 112, via drawback is mitigated, and the TEVA 124 is prevented from shorting to the bottom electrode 108 when a registration error occurs. As a result of the horn shape of the sidewall spacer 114, the second lower surface 124s2 of the TEVA 124 is decoupled from the bottom electrode 108 by the sidewall spacer 114.

Figure 1B:
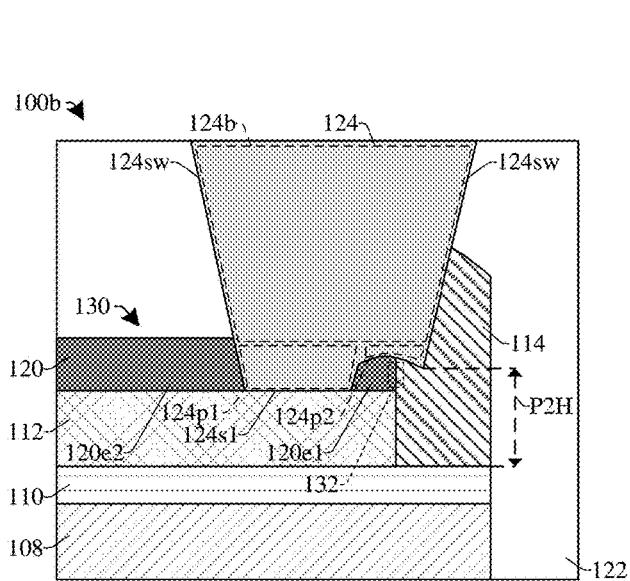
FIG. 1B illustrates a cross-sectional view of some embodiments of a memory device with a top electrode via (TEVA) overlying an interface between a sidewall spacer and a mask, and separated from a bottom electrode.

FIG. 1B illustrates a cross-sectional view 100b of some embodiments of memory device 130 with a TEVA 124 overlying an interface between the sidewall spacer 114 and the mask 120 and separated from the bottom electrode 108.

Cross-sectional view 100b shows further details from cross-sectional view 100a corresponding to the TEVA 124, mask 120, top electrode 112, and sidewall spacer 114. The first edge portion 120e1 of the mask 120 is separated from the second edge portion 120e2 of the mask 120 by a first TEVA protrusion 124p1. The first edge portion 120e1 is defined by edges of the TEVA 124, sidewall spacer 114, and top electrode 112. The second edge portion 120e2 is defined by edges of the TEVA 124, top electrode 112, sidewall spacer 114, and upper dielectric structure 122 (see also FIG. 1A).

An inner sidewall of the sidewall spacer 114 meets an outer sidewall of the mask 120 at an interface 132 aligned below TEVA 124. The TEVA 124 has a TEVA body 124b defined between tapered outer sidewalls 124sw of the TEVA 124 and the TEVA body 124b is disposed over the top electrode 112 and directly overlying the interface 132. The first TEVA protrusion 124p1 extends from a lower portion of the TEVA body 124b, through the mask 120, and to an upper surface of the top electrode 112. The first TEVA protrusion 124p1 is spaced apart from the interface 132 and the sidewall spacer 114 by the first edge portion 120e1 of the mask 120. A second TEVA protrusion 124p2 extends from a lower portion of the TEVA body 124b aligned over the interface 132. The second TEVA protrusion 124p2 is disposed over the first edge portion 120e1 of the mask 120 and extends into the sidewall spacer 114. A lowest edge of the second TEVA protrusion 124p2 is above the top electrode 112 with a lowest edge height P2H above the data storage structure 110 that is greater than a thickness of the top electrode 112.

Figure 1D:
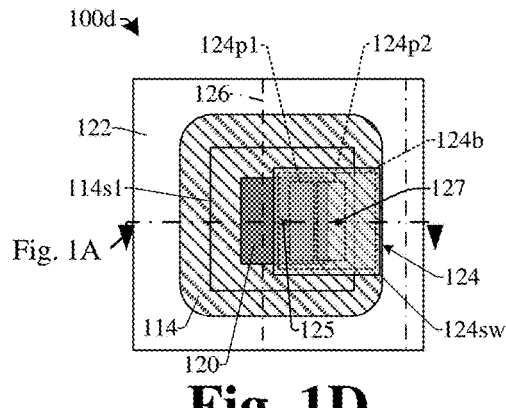
FIG. 1D illustrates a top view of some embodiments of a memory device with a horn shaped sidewall spacer.
Figure 1E:
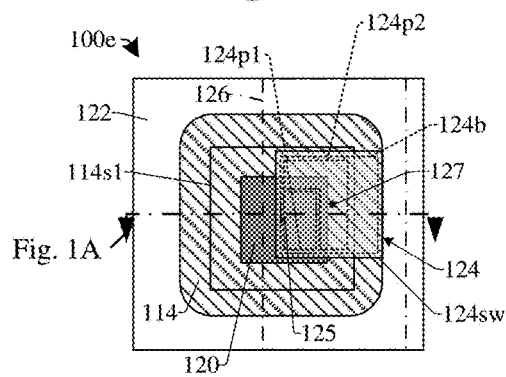
FIG. 1E illustrates a top view of some embodiments of a memory device with a horn shaped sidewall spacer.
Figure 1C:
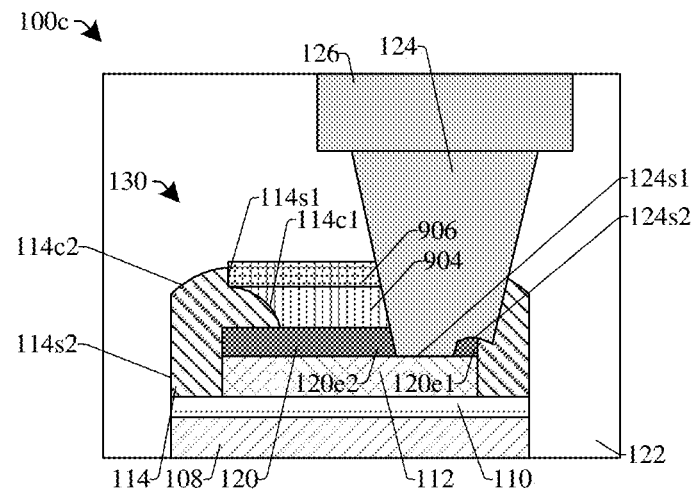
FIG. 1C illustrates a cross-sectional view of some alternative embodiments of a memory device with a first and second hard mask structure between the top electrode via (TEVA) and the sidewall spacer.

FIG. 1C illustrates a cross-sectional view 100c of some alternative embodiments of memory device 130 with a first hard mask structure 904 and a second hard mask structure 906 between the TEVA 124 and sidewall spacer 114. Cross-sectional view 100c shows the same features as cross-sectional view 100a with the addition of the first hard mask structure 904 and the second hard mask structure 906.

The first hard mask structure 904 is disposed on the mask 120 and extends laterally between the first curved portion 114c1 of the sidewall spacer 114 and the TEVA 124. The second hard mask structure 906 is disposed on the first hard mask structure 904 and extends laterally between the first substantially vertical portion 114s1 and the TEVA 124. Furthermore, the second hard mask structure 906 extends above the sidewall spacer 114.

The first hard mask structure 904 and second hard mask structure 906 may, for example, be or comprise silicon, a nitride (e.g., silicon nitride), an oxide (e.g., silicon oxynitride), phosphosilicate glass (PSG), tetraethyl orthosilicate (TEOS), or the like. In some embodiments, the first hard mask structure 904 and second hard mask structure 906 may comprise the same material or different material. In similar or other embodiments, the first hard mask structure 904 and second hard mask structure 906 may comprise differing dielectric constants. The first hard mask structure 904 and second hard mask structure 906 have differing etch rates where the first hard mask structure 904 may comprise a lower density of material relative to the second hard mask structure 906. In some embodiments, the first hard mask structure 904 includes a density gradient with a lower density at the bottom of the first hard mask structure 904 adjacent to the mask 120, and a higher density at the top of the first hard mask structure 904 adjacent to the second hard mask structure 906.

The first hard mask structure 904 and second hard mask structure 906 are used in processing steps to form the sidewall spacer 114.

FIG. 1D illustrates a top view 100d of some embodiments of memory device 130 with a TEVA 124 overlying an interface between the sidewall spacer 114 and the mask 120 and separated from the bottom electrode 108, and can be consistent with FIG. 1A or FIG. 1B, among others. More particularly, FIG. 1D shows an example where the memory device 130 has a central axis 125 that is laterally offset in one direction (e.g., x-direction) from a central axis 127 of the TEVA 124. Thus, the first TEVA protrusion 124p1 and second TEVA protrusion 124p2 are each linear segments, as viewed from above.

FIG. 1E illustrates a top view 100e of other embodiments of a memory device 130 with a TEVA 124 overlying an interface between the sidewall spacer 114 and the mask 120 and separated from the bottom electrode 108, and can be consistent with FIG. 1A or FIG. 1B, among others. In FIG. 1E, the memory device 130 has a central axis 125 that is laterally offset in two directions (e.g., x-direction and y-direction) from a central axis 127 of the TEVA 124, such that the first edge portion 120e1 of the mask "turns a corner" around the first protrusion 124p1, as viewed from above.

Note that although FIGS. 1D and 1E show the memory device and TEVA being generally square shapes that are concentric with one another, in other embodiments, the memory device 130 and TEVA 124 could be circular, oval, square, square with rounded corners, rectangular, or rectangular with rounded corners, among other shapes.

Figure 2:
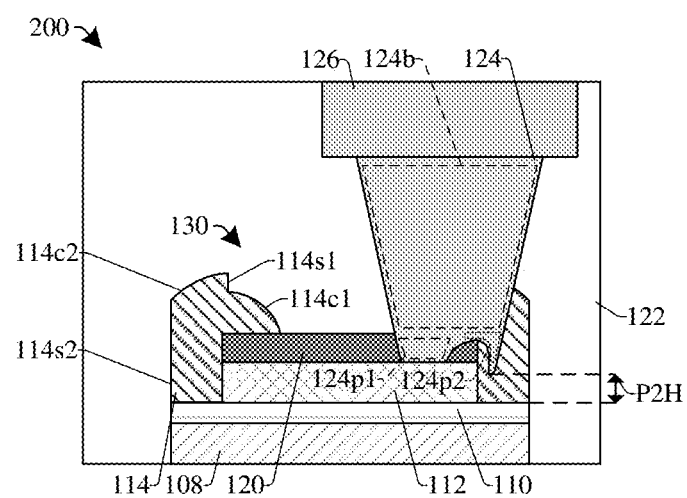
FIG. 2 illustrates a cross-sectional view of some alternative embodiments of a memory device with a second top electrode via (TEVA) protrusion that extends past a top surface of the top electrode.

FIG. 2 illustrates a cross-sectional view 200 of some alternative embodiments of memory device 130 with a second TEVA protrusion 124p2 that extends past a top surface of the top electrode 112.

Cross-sectional view 200 shows alternative embodiments of the second TEVA protrusion 124p2 relative to FIGS. 1A and 1B. In cross-sectional view 200, the second TEVA protrusion 124p2 extends past a top surface of the top electrode 112 within the sidewall spacer 114. The lowest edge height P2H of the second TEVA protrusion 124p2 above the data storage structure 110 is less than the thickness of the top electrode 112. As such, a lowermost edge of the second TEVA protrusion 124p2 disposed in the sidewall spacers 114 is between the mask 120 and the data storage structure 110. In this embodiment, the TEVA 124 was formed with a registration error and the sidewall spacer 114 isolates the second TEVA protrusion 124p2 from the data storage structure 110 and bottom electrode 108. In alternative embodiments, the first hard mask structure 904 and second hard mask structure 906 depicted in cross-sectional view 100c can be included in cross-sectional view 200.

Figure 3A:
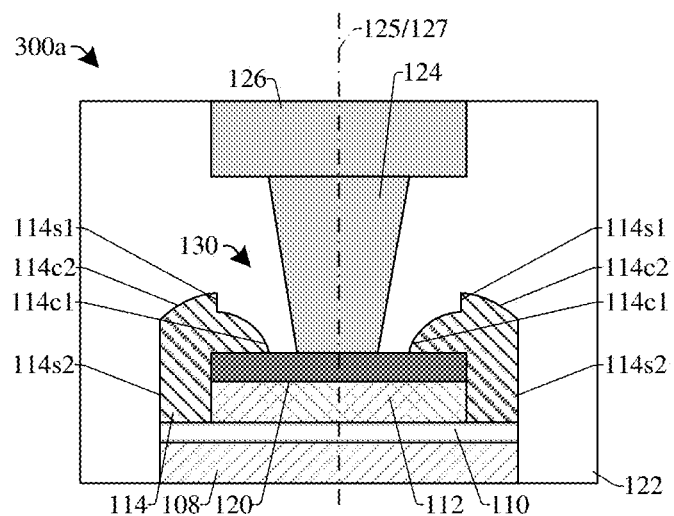
FIG. 3A illustrates a cross-sectional view of some embodiments of a memory device with a top electrode via (TEVA) aligned between and separated from inner edges of a sidewall spacer that is horn shaped.

FIG. 3A illustrates a cross-sectional view 300a of some embodiments of memory device 130 with a TEVA 124 aligned between and separated from inner edges of a sidewall spacer 114 that is horn shaped.

Cross-sectional view 300a shows TEVA 124 and upper metal feature 126 aligned between inner edges of the sidewall spacer 114 where the TEVA 124 is separated from the sidewall spacer 114 by mask 120 and the upper dielectric structure 122. In this aspect, TEVA 124 is formed over the memory device coupling to the top electrode 112 with an aligned registration. The bottom surface of TEVA 124 is disposed offset from outer edges of the top electrode 112, but the memory device and upper metal feature and TEVA have central axes 125/127 that are aligned in this example. As such, the sidewall spacer 114 is symmetric about the central axis of the top electrode where the first curved portion 114c1, the first substantially vertical portion 114s1, and the second curved portion 114c2 overlie opposing edges of the mask 120 and top electrode 112.

Figure 3B:
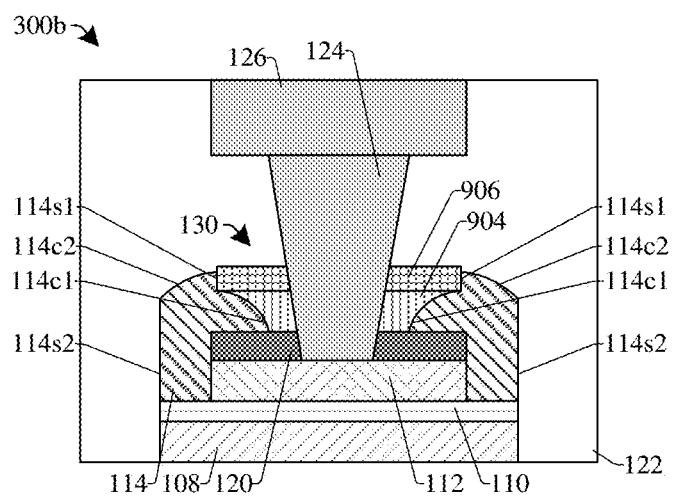
FIG. 3B illustrates a cross-sectional view of some embodiments of a memory device with a top electrode via (TEVA) separated from a sidewall spacer by a first hard mask structure and a second hard mask structure.

FIG. 3B illustrates a cross-sectional view 300b of some embodiments of memory device 130 with a TEVA 124 separated from a sidewall spacer 114 by a first hard mask structure 904 and a second hard mask structure 906.

Cross-sectional view 300b shows the same features as cross-sectional view 300a with the inclusion of the first hard mask structure 904 and the second hard mask structure 906. The first hard mask structure 904 is disposed on the mask 120 and extends from outer sidewalls of TEVA 124 to the first curved portions 114c1 of the sidewall spacer 114. The second hard mask structure 906 is disposed on the first hard mask structure and extends from outer sidewalls of TEVA 124 to the first substantially vertical portions 114s1 of the TEVA 124. Furthermore, the second hard mask structure 906 extends above a top surface of the of the sidewall spacer 114.

Figure 4:
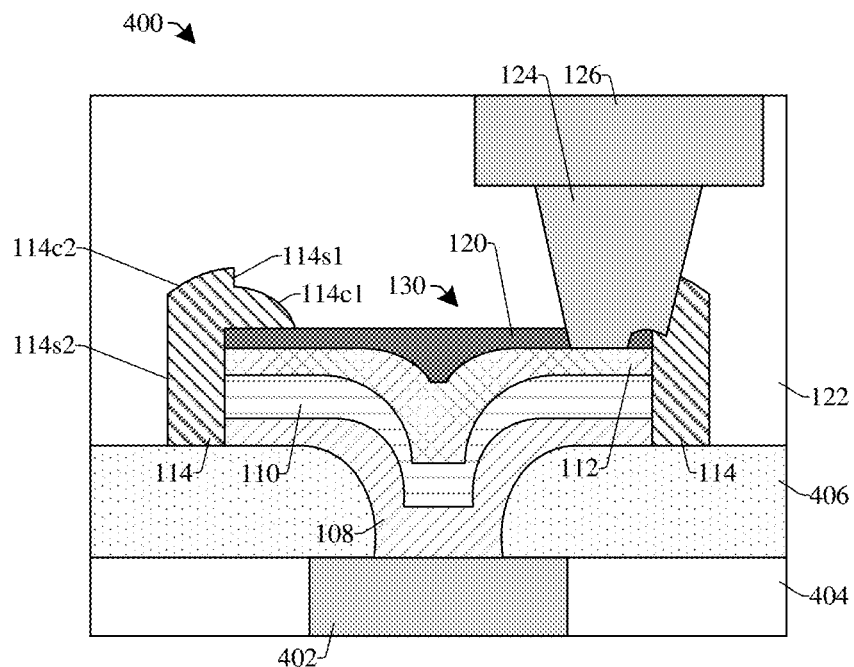
FIG. 4 illustrates a cross-sectional view of some alternative embodiments of memory device with a sidewall spacer that is horn shaped.

FIG. 4 illustrates a cross-sectional view 400 of some alternative embodiments of memory device 130 with a sidewall spacer 114 that is horn shaped.

Cross-sectional view 400 shows a memory device 130 that is an alternative memory device compared to the memory device 130 of FIGS. 1-3. A lower metal feature 402 is disposed in a lower dielectric structure 404. A middle dielectric structure 406 is disposed over the lower dielectric structure 404. In various embodiments, the middle dielectric structure 406 may comprise one or more of silicon oxynitride (e.g., $N_2OSi_2$), silicon dioxide (e.g., $SiO_2$), silicon carbide (e.g., SiC), silicon nitride ($Si_3N_4$), Tetraethyl orthosilicate (TEOS) oxide, a low-κ dielectric, or the like. In some embodiments, the lower dielectric structure 404 may comprise one or more of silicon dioxide (e.g., $SiO_2$), doped silicon dioxide (e.g., carbon doped silicon dioxide), silicon oxynitride (e.g., $N_2OSi_2$), borosilicate glass (BSG), phosphoric silicate glass (PSG), borophosphosilicate glass (BPSG), fluorinated silicate glass (FSG), or the like. In some embodiments, the lower metal feature 402 is a wire, pads, or the like. In some embodiments, the lower metal feature 402 is or comprises copper, tungsten, aluminum, some other suitable material(s), or any combination of the foregoing.

The memory device 130 overlies the middle dielectric structure 406 and extends through the middle dielectric structure 406 to the lower metal feature 402. The bottom electrode 108 forms a bottom electrode via (BEVA) extending through the middle dielectric structure 406 to the lower metal feature 402. Further, the bottom electrode 108 has a horizontal bottom surface coupled to the lower metal feature 402 and curved outer sidewalls that extend from the horizontal bottom surface of the bottom electrode 108 to a top surface of the middle dielectric structure 406. Further, a lower horizontally extending surface of the bottom electrode 108 that is below an upper surface of the middle dielectric structure 406 is aligned over the horizontal bottom surface of the bottom electrode 108. Interior sidewalls of the bottom electrode 108 extend from the lower horizontally extending surface to a top surface of the bottom electrode 108 that is above the top surface of the middle dielectric structure 406. The lower horizontally extending surface of the bottom electrode 108 defines a recess within an upper surface of the bottom electrode 108.

The data storage structure 110 is disposed on the bottom electrode 108. A bottom surface of the data storage structure 110 is recessed below a top surface of the bottom electrode 108 and is recessed below a portion of the curved outer sidewalls of the bottom electrode 108. Curved sidewalls of the data storage structure 110 extend from the bottom surface of the data storage structure 110 to a top surface of the bottom electrode 108.

The top electrode 112 is disposed on the data storage structure 110. A horizontal bottom surface of the top electrode 112 is below the top surface of the bottom electrode 108. Curved outer sidewalls of the top electrode 112 extend from the horizontal bottom surface of the top electrode 112 to a top surface of the data storage structure 110. Curved interior sidewalls of the top electrode 112 extend in opposing directions from a common point that is below a top surface of the top electrode 112 to a top surface of the top electrode 112. In some aspects, the common point is a central axis of the top electrode 112. In some aspects the common point of the top electrode 112 is below a bottom surface of the top electrode 112. In some aspects, the bottom electrode 108, the data storage structure 110, and the top electrode 112 are substantially symmetric about a line bisecting the bottom electrode 108, the data storage structure 110, and the top electrode 112. In some aspects, the line bisects through the common point of the top electrode 112. The bottom surface of the top electrode 112 is aligned over the recess in the upper surface of the bottom electrode 108 and the bottom surface of the top electrode 112 is narrower than the lower horizontally extending surface of the bottom electrode 108.

The TEVA 124 can be formed with a registration error where the TEVA 124 extends through the mask 120 to the top electrode 112, and extends laterally into the sidewall spacer 114, as described similarly in preceding embodiments. The sidewall spacer 114 extends from a top surface of the middle dielectric structure 406 and extends along the bottom electrode 108, data storage structure 110, top electrode 112, and mask 120. The sidewall spacer 114 can have a horn shaped structure defined by the first curved portion 114c1, first substantially vertical portion 114s1, second curved portion 114c2, and second substantially vertical portion 114s2. By forming the first curved portion 114c1 and second curved portion 114c2 of the sidewall spacer 114 to overlap with the top electrode 112, via drawback is mitigated, and the TEVA 124 is prevented from shorting to the bottom electrode 108 when a registration error occurs. As a result of the horn shape of the sidewall spacer 114, the second lower surface 124s2 of the TEVA 124 is decoupled from the bottom electrode 108 by the sidewall spacer 114.

Cross-sectional view 400 shows TEVA 124 disposed offset from the central axis of the top electrode 112. In alternative embodiments, TEVA 124 can be aligned with a central axis of the top electrode 112, similar to the description of FIG. 3.

Figure 5:
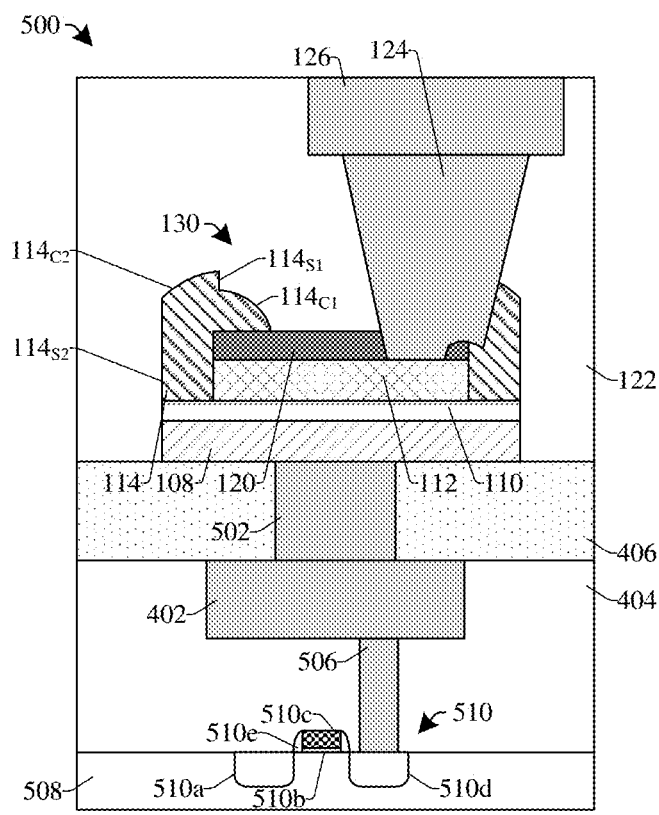
FIG. 5 illustrates a cross-sectional view of additional embodiments of memory device with a sidewall spacer that is horn shaped coupled to an access device.

FIG. 5 illustrates a cross-sectional view 500 of additional embodiments of memory device 130 with a sidewall spacer 114 that is horn shaped coupled to an access device 510.

Cross-sectional view 500 shows the memory device 130, sidewall spacer 114, TEVA 124, and upper metal feature 126 of FIGS. 1A-1B. The middle dielectric structure 406 is disposed under the upper dielectric structure 122 where a middle conductive feature is disposed within the middle dielectric structure 406 and the middle conductive feature 502 is coupled to the bottom electrode 108. In some embodiments, the middle conductive feature 502 is an extension of the bottom electrode 108.

The lower dielectric structure extends below the middle dielectric structure 406. The lower metal feature 402 is disposed within the lower dielectric structure and electrically couples to the middle conductive feature 502. A conductive contact 506 extends from the lower metal feature 402 and couples to an access device 510 arranged within a substrate 508 that extends below the lower dielectric structure 404.

In some embodiments, the middle conductive feature 502, lower metal feature 402, and conductive contact 506 is or comprises titanium nitride, platinum, aluminum copper, gold, titanium, tantalum, tantalum nitride, tungsten, tungsten nitride, or alloys or combinations of the foregoing. In some embodiments, the upper dielectric structure 122 is or comprises silicon dioxide (e.g., $SiO_2$), doped silicon dioxide (e.g., carbon doped silicon dioxide), silicon oxynitride (e.g., $N_2OSi_2$), borosilicate glass (BSG), phosphoric silicate glass (PSG), borophosphosilicate glass (BPSG), fluorinated silicate glass (FSG), or the like.

In some embodiments the substrate 508 is referred to as a semiconductor substrate. In some embodiments, the access device 510 may comprise a transistor device (e.g., a metal-oxide-semiconductor field-effect transistor (MOSFET), a bi-polar junction transistor (BJT), a high electron mobility transistor (HEMT), or the like). In some embodiments, the substrate 508 may comprise a semiconductor material (e.g., silicon, germanium, or the like).

In some embodiments, the access device 510 comprises a source region 510a a drain region 510d between which a gate electrode 510c is arranged. The access device 510 further comprises a gate dielectric 510b arranged below the gate electrode 510c and a gate spacer 510e arranged along sidewalls of the gate dielectric 510b and gate electrode 510c.

The access device 510 is coupled to the memory device 130 through middle conductive feature 502, lower metal feature 402, and conductive contact 506. Sidewall spacer 114 decouples TEVA 124 from bottom electrode 108 when the TEVA 124 is formed with a registration error. It is appreciated that memory device 130, sidewall spacer 114, and TEVA 124 in FIG. 5 can be replaced by features of preceding figures and accordingly coupled to access device 510. As such, read/write operations of memory device 130, initiated by access device 510, are conducted with improved reliability in the presence of a TEVA 124 formed with a registration error.

FIGS. 6-16 illustrate a series of cross-sectional views 600-1600 of some embodiments of a method for forming a semiconductor structure that includes a memory device with a horn shaped sidewall spacer 114 and TEVA 124 isolated from a bottom electrode by the sidewall spacer 114. Although FIGS. 6-15 are described in relation to a method, it will be appreciated that the structures disclosed in FIGS. 6-15 are not limited to such a method, but instead may stand alone as structures independent of the method.

Figure 6:
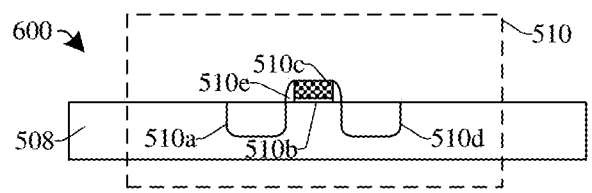
FIGS. 6-16 illustrate a series of cross-sectional views of some embodiments of a method for forming a semiconductor structure that includes a memory device with a horn shaped sidewall spacer and TEVA isolated from a bottom electrode by the sidewall spacer.

As shown in cross-sectional view 600 of FIG. 6, a substrate 508 is provided. An access device 510 is formed within the substrate 508. In various embodiments, the substrate 508 may be any type of semiconductor body (e.g., silicon, SiGe, silicon on insulator (SOI), etc.), such as a semiconductor wafer and/or one or more die on a wafer, as well as any other type of semiconductor and/or epitaxial layers, associated therewith. In some embodiments, the access device 510 may be or comprise a transistor. In some such embodiments, the access device 510 may be formed by depositing a gate dielectric film and a gate electrode film over the substrate 508. The gate dielectric film and the gate electrode film are subsequently patterned to form a gate dielectric (e.g., 510b) and a gate electrode (e.g., 510c). A gate spacer (e.g., 510e) is formed along sidewalls of the gate dielectric (e.g., 510b) and gate electrode (e.g., 510c). The substrate 508 may be subsequently implanted to form a source region (e.g., 510a) and a drain region (e.g., 510d) within the substrate 508 on opposing sides of the gate electrode (e.g., 510c).

Figure 7:
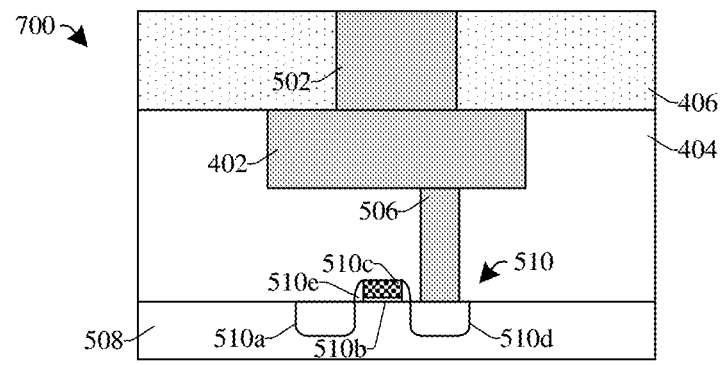

As shown in cross-sectional view 700 of FIG. 7, a conductive contact 506 and a lower metal feature 402 are formed within a lower dielectric structure 404 over the substrate 508. The conductive contact 506 is formed in contact with one of the drain region (e.g., 510d) of access device 510.

In some embodiments, to form the conductive contact 506 and the lower metal feature 402 within the lower dielectric structure 404, a first portion (e.g., an oxide, a low-k dielectric, an ultra low-k dielectric, or the like) of the lower dielectric structure 404 is deposited and selectively etched to define a hole or trench. A conductive material (e.g., copper, aluminum, etc.) is deposited within the hole or trench to form the conductive contact 506, and a planarization process (e.g., a chemical mechanical planarization process) is performed. After the planarization, the foregoing processing steps are repeated to form the lower metal feature 402.

A middle dielectric structure 406 is formed over the lower dielectric structure 404 and the lower metal feature 402. In some embodiments, the middle dielectric structure 406 is referred to as a middle dielectric layer or a dielectric layer. In some embodiments, the middle dielectric structure 406 may comprise one or more of silicon oxynitride (e.g., $N_2OSi_2$), silicon dioxide (e.g., $SiO_2$), silicon carbide (e.g., SiC), silicon nitride ($Si_3N_4$), Tetraethyl orthosilicate (TEOS) oxide, a low-κ dielectric, or the like. In some embodiments, the middle dielectric structure 406 may be formed by one or more different deposition processes (e.g., physical vapor deposition (PVD), chemical vapor deposition (CVD), plasma enhanced CVD (PE-CVD), atomic layer deposition (ALD), sputtering, or the like).

A middle conductive feature 502 is formed within the middle dielectric structure 406 where the middle conductive feature 502 is coupled to the lower metal feature 402. In some embodiments, the middle conductive feature 502 is formed by selectively etching the middle dielectric structure 406 to define an opening. A conductive material (e.g., copper, aluminum, etc.) is deposited within the opening to form the middle conductive feature 502.

Figure 8:
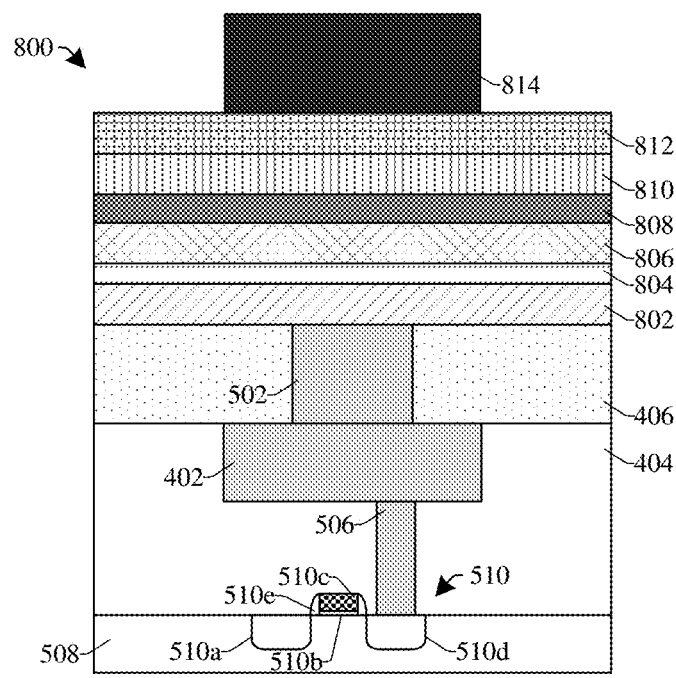

As shown in cross-sectional view 800 of FIG. 8, a series of layers are formed over the middle dielectric structure 406 and the middle conductive feature 502.

A bottom electrode layer 802 is formed along a top surface of the middle dielectric structure 406 and the middle conductive feature 502. A data storage layer 804 is formed on the bottom electrode layer 802. A top electrode layer 806 is formed on the data storage layer 804. A masking layer 808 is formed on the top electrode layer 806. A first hard mask layer 810 is formed on the masking layer 808. A second hard mask layer 812 is formed on the first hard mask layer 810. The bottom electrode layer 802, the data storage layer 804, the top electrode layer 806, the masking layer 808, the first hard mask layer 810, and the second hard mask layer 812 are formed with individual layer thicknesses of 600 angstroms to 1500 angstroms. A masking feature 814 is formed on the second hard mask layer 812 where the masking feature 814 is aligned with a center of the middle conductive feature 502 and masking feature 814 is offset from outer sidewalls of second hard mask layer 812.

In various embodiments, the top electrode layer 806 and bottom electrode layer 802 are or comprise titanium nitride, platinum, aluminum copper, gold, titanium, tantalum, tantalum nitride, tungsten, tungsten nitride, or alloys or combinations of the foregoing. In some embodiments, the data storage layer 804 comprises one or more doped layers. In these embodiments, or additional embodiments, the data storage layer 804 is or comprises hafnium oxide, zirconium oxide, aluminum oxide, tantalum oxide, hafnium aluminum oxide, hafnium zirconium oxide, or the like. In various embodiments, when the data storage layer 804 is doped, the dopants may comprise nitrogen, fluorine, carbon, phosphorous, or the like. In various embodiments the masking layer 808 is or comprises a carbide (e.g., silicon carbide), a nitride (e.g., silicon nitride), an oxide (e.g., silicon oxy-nitride), or the like.

In various embodiments, the first hard mask layer 810 and the second hard mask layer 812 is or comprise silicon, a nitride (e.g., silicon nitride), an oxide (e.g., silicon oxynitride), phosphosilicate glass (PSG), tetraethyl orthosilicate (TEOS), or the like. The first hard mask layer 810 and the second hard mask layer 812 may comprise the same material or different material, or may comprise differing dielectric constants. The first hard mask layer 810 may comprise a lower density of material relative to the second hard mask layer 812. In some embodiments, a top surface of the first hard mask layer 810 undergoes a surface treatment (not shown) that can, for example, be a nitrous oxide ($N_2O$) process, a thermal process, laser annealing process, or the like to form the first hard mask layer 810 with a density gradient. The surface treatment is performed before the second hard mask layer 812 is formed. As such a bottom surface of the first hard mask layer 810 has a lower density relative to a higher density at the top surface of the first hard mask layer 810. For example, in cases where the surface treatment is a nitrogenation process, upper regions of the first hard mask layer 810 have higher concentrations of nitrogen, and this nitrogen concentration gradually drops towards lower regions of the first hard mask layer 810. As nitrogen concentration is inversely proportional to etch rate, upper regions of the first hard mask layer have lower etching rates than lower regions of the first hard mask layer. Generally, the second hard mask layer 812 is formed with a second etch rate, and this second etch rate is less than that (e.g., a first etch rate) of the upper regions of the first hard mask layer 810. In some embodiments the first etch rate to second etch rate ratio can be 1.5:1 to 5:1.

In some embodiments, the bottom electrode layer 802 may be formed by depositing a liner (not shown) followed by depositing a conductive material. In various embodiments, the liner may comprise a glue layer configured to increase adhesion between adjacent layers and/or a diffusion barrier layer configured to prevent diffusion between adjacent layers. In some embodiments, the bottom electrode layer 802 may, for example, be deposited by a PVD, CVD, ALD, plasma-enhanced CVD (PECVD), plasma-enhanced ALD (PEALD) process, sputtering, or other suitable process.

In some embodiments, the bottom electrode layer 802, data storage layer 804, top electrode layer 806, masking layer 808, first hard mask layer 810, and second hard mask layer 812 may, for example, be deposited by PVD, CVD, ALD, PECVD, PEALD process, sputtering, or the like.

In some embodiments, masking feature 814 may, for example, be deposited by PVD, CVD, ALD, or the like, and may be or comprise a silicon-based material. Forming masking feature 814 includes a patterning process (not shown). The patterning process may, for example, comprise any of a photolithography process and an etching process. In some embodiments (not shown), a photoresist is formed over the masking feature 814. The photoresist is patterned by an acceptable photolithography technique to develop an exposed photo resist. With the exposed photo resist in place, an etch is performed to transfer the pattern from the exposed photo resist to the underlying layers, for example, the masking feature 814. The etching process may comprise a wet etching process, a dry etching process, or some other suitable etching process.

Figure 9:
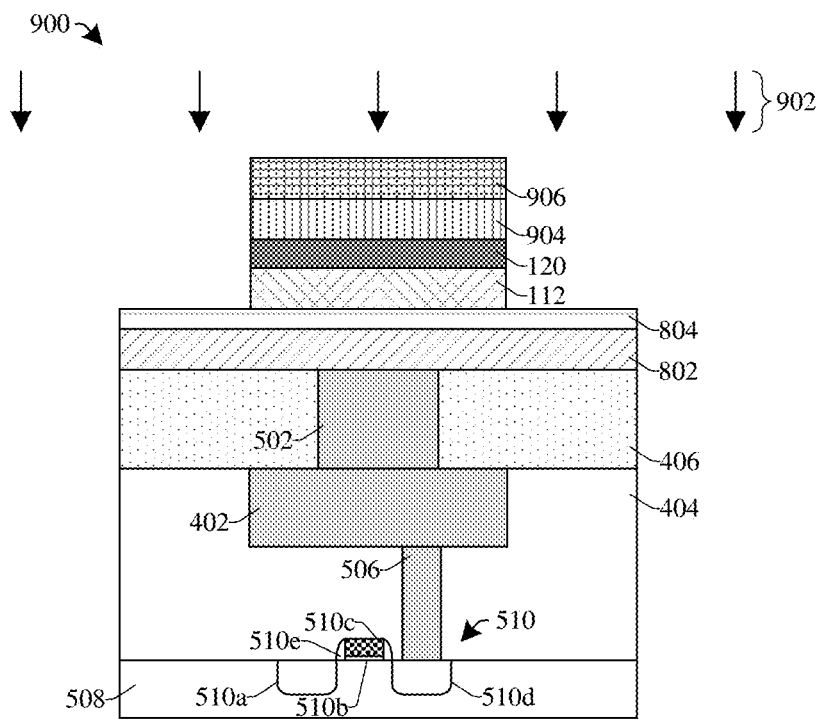

As shown in cross-sectional view 900 of FIG. 9, a top electrode 112, mask 120, first hard mask structure 904, and second hard mask structure 906 according to a first etching process 902.

The top electrode layer 806 of FIG. 8, masking layer 808 of FIG. 8, first hard mask layer 810 of FIG. 8, and second hard mask layer 812 of FIG. 8 are etched in the presence of the masking feature 814 of FIG. 8 according to a first etching process 902. The first etching process 902 forms the top electrode 112, mask 120, first hard mask structure 904, and second hard mask structure 906. After the first etching process 902, the masking feature 814 of FIG. 8 is removed according to a removal process. In some embodiments, the first etching process 902 may comprise an etchant such as fluorine or chlorine, or the like or other suitable etching process. The top electrode 112, mask 120, first hard mask structure 904, and second hard mask structure 906 are formed with substantially aligned outer sidewalls and aligned directly over middle conductive feature 502 with a width of 30 nanometers to 160 nanometers.

Figure 10:
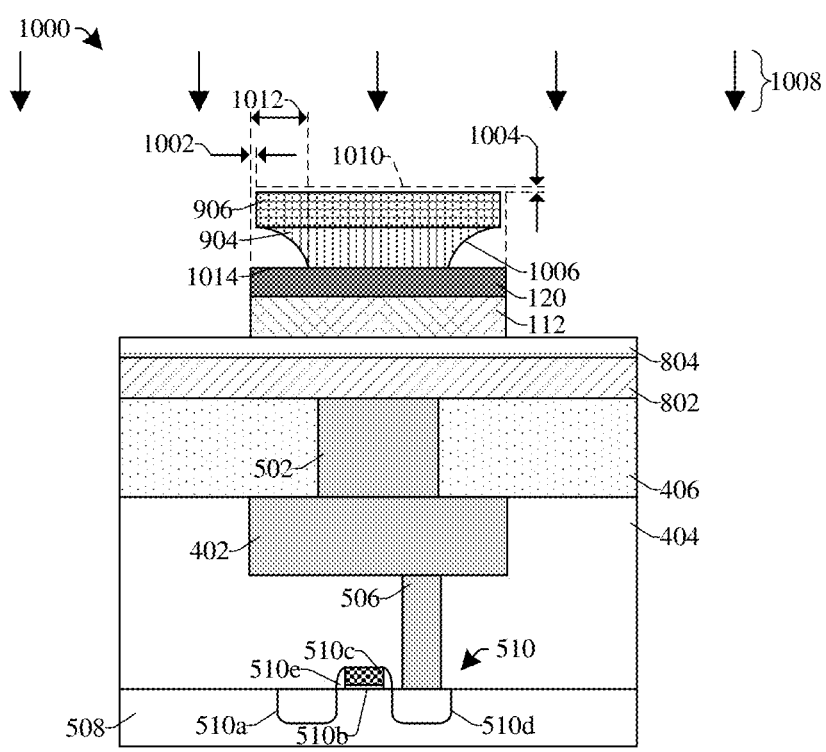

As shown in cross-sectional view 1000 of FIG. 10, the first hard mask structure 904 and second hard mask structure 906 are selectively etched according to a second etching process 1008.

First hard mask structure 904 and second hard mask structure 906 are selectively etched according to the second etching process 1008, where the first hard mask structure 904 and second hard mask structure 906 are reduced or pulled back from an original hard mask profile 1010. The second etching process 1008 is a wet etch where the first hard mask structure 904 is etched more than the second hard mask structure 906 due to the first etch rate of the first hard mask structure 904 that is greater than the second etch rate of the second hard mask structure 906. The second etching process 1008 can include an etchant such as phosphoric acid, hydrofluoric acid (HF), diluted hydrofluoric acid (DHF), buffered HF (BHF), buffered oxide, hydrochloric acid, a silicon etchant, a combination thereof, or other etchants. The second etching process 1008 can be at a temperature of 25 Celsius (C) to 40 C for 3 minutes to 15 minutes where the temperature and time is based on a concentration of the etchant.

The original hard mask profile 1010 denotes the outer profile of the first hard mask structure 904 and second hard mask structure 906 from FIG. 9 before the second etching process 1008 is applied. The original hard mask profile 1010 denotes outer edges substantially aligned with outer sidewalls of mask 120 and a top surface aligned with the top surface of the second hard mask structure 906 of FIG. 9 before the second etching process 1008. The second hard mask structure 906 is reduced in height by a first reduction 1004 from a top surface of the original hard mask profile 1010. Outer edges of the second hard mask structure 906 are pulled back from outer edges of the original hard mask profile 1010 by a second reduction 1002, where the second reduction 1002 forms outer edges of the second hard mask structure 906 that are aligned with an interior of mask 120 and top electrode 112. The first hard mask structure 904 is etched more than the second hard mask structure 906 where the second etching process 1008 forms the first hard mask structure 904 with curved outer sidewalls 1006. The curved outer sidewalls 1006 are concave and extend from a bottom surface of the second hard mask structure 906 to a top surface of mask 120 where a width of a bottom surface of the first hard mask structure 904 is less than a width of a top surface of the first hard mask structure 904. The curved outer sidewalls 1006 can be formed due to the density gradient of the first hard mask structure. Furthermore, the width of the bottom surface of the first hard mask structure 904 is less than a width of the second hard mask structure 906.

Outer edges at the bottom surface of the first hard mask structure 904 are pulled back from outer edges of the original hard mask profile 1010 by a third reduction 1012. As such, a top surface 1014 of the mask 120 is exposed by the second etching process 1008 of the first hard mask structure 904. The first reduction 1004, the second reduction 1002, and the third reduction 1012 can be formed with a pullback of 50 angstroms to 200 angstroms.

The second etching process 1008 form a profile of the first hard mask structure 904 and second hard mask structure 906 that result in forming the horn shape for the sidewall spacer 114 in subsequent processing steps.

Figure 11:
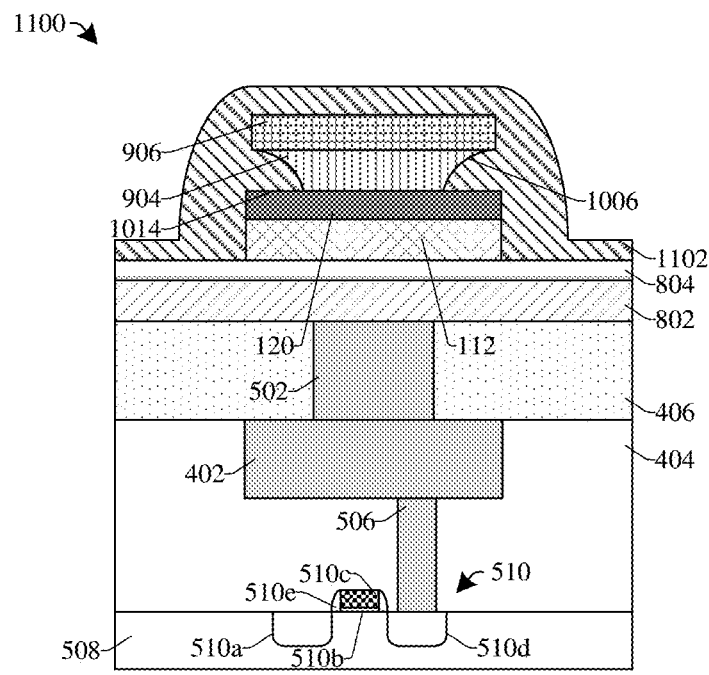

As shown in cross-sectional view 1100 of FIG. 11, a sidewall spacer layer 1102 is formed over first hard mask structure 904 and second hard mask structure 906.

The sidewall spacer layer 1102 is formed over the data storage layer 804, along sidewalls of the top electrode 112 and mask 120, the exposed top surface 1014 of the mask 120, the curved outer sidewalls 1006 of the first hard mask structure 904, outer edges and top surface of the second hard mask structure 906. In some embodiments, the sidewall spacer layer 1102 may, for example, be deposited by a PVD, CVD, ALD, PECVD, PEALD, sputtering, or other suitable process. In some embodiments, the sidewall spacer layer 1102 may, for example, comprise a carbide (e.g., silicon carbide), a nitride (e.g., silicon nitride), an oxide (e.g., silicon oxy-nitride), or the like.

Figure 12:
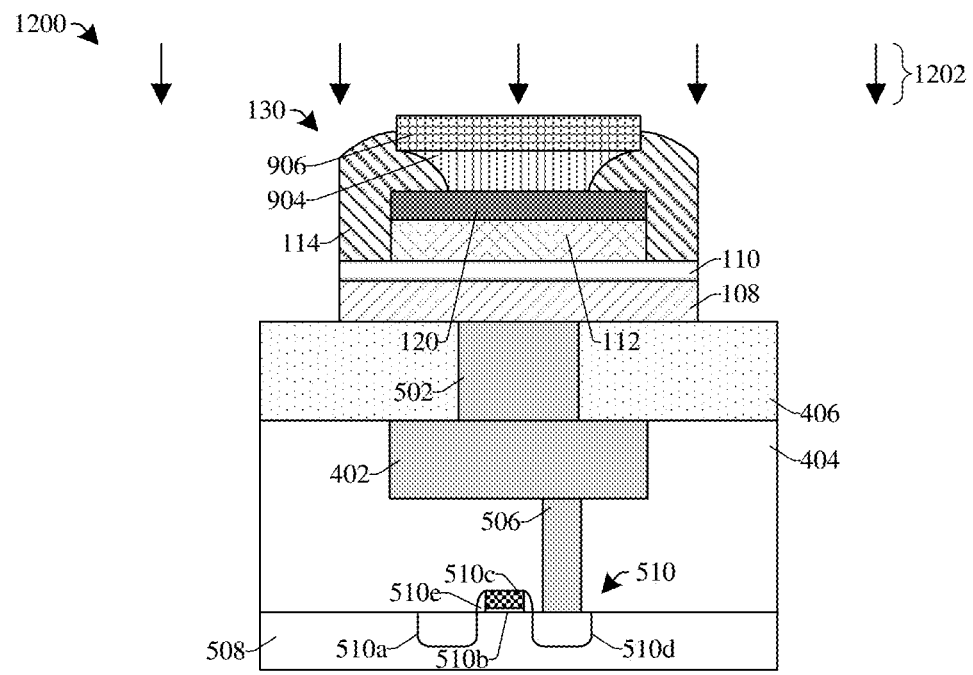

As shown in cross-sectional view 1200 of FIG. 12, the sidewall spacer layer 1102, data storage layer 804, and bottom electrode layer 802 are etched according to a third etching process 1202.

The sidewall spacer layer 1102 of FIG. 11, data storage layer 804 of FIG. 11, and bottom electrode layer 802 of FIG. 11 are etched according to a third etching process 1202 forming sidewall spacer 114, data storage structure 110, and bottom electrode 108 respectively. The third etching process 1202 forms memory device 130 comprising the bottom electrode 108, data storage structure 110, and top electrode 112. Furthermore, the third etching process 1202 exposes the top surface of the second hard mask structure 906. In some embodiments, sidewalls of the second hard mask structure 906 are exposed by the third etching process 1202. In other embodiments, the third etching process 1202 exposes the top surface of the second hard mask structure 906 and does not expose sidewalls of the second hard mask structure 906 (not shown). The third etching process 1202 forms outer sidewalls of the bottom electrode 108, data storage structure 110, and sidewall spacer 114 that are substantially aligned. The third etching process 1202 further forms a top surface of sidewall spacer 114 that is curved and convex.

In some embodiments, the third etching process 1202 includes forming a patterned mask (not shown) over the sidewall spacer layer 1102 and exposing the underlying layers exposed through the patterned mask to an etching process. In some embodiments, the etching process may be a dry etch or a wet etch. After the etching process, the patterned mask is removed according to a suitable removal process, for example, a chemical wash process.

Figure 13:
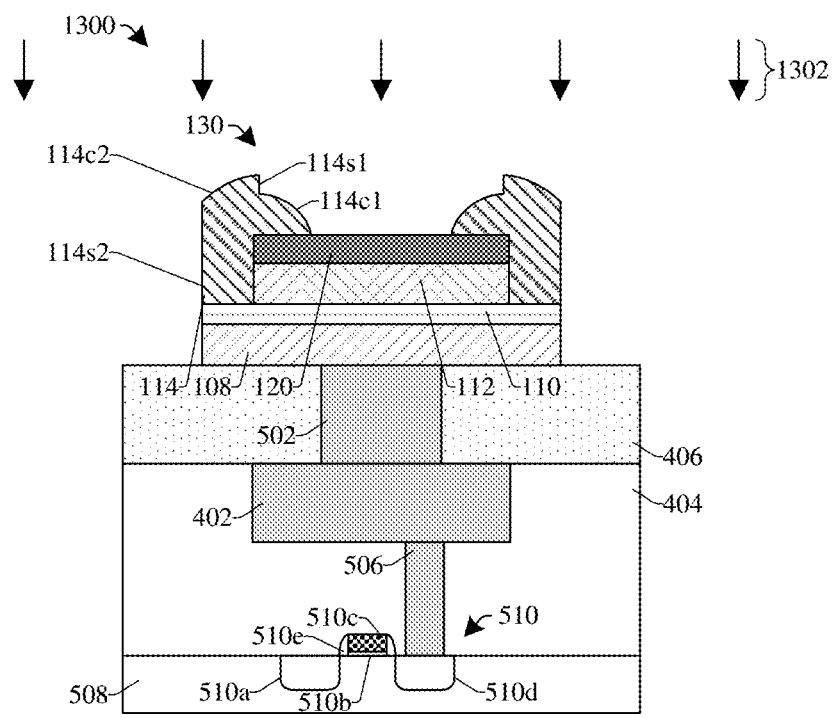

As shown in cross-sectional view 1300 of FIG. 13, the first hard mask structure 904 and second hard mask structure 906 are removed according to a fourth etching process 1302.

The first hard mask structure 904 of FIG. 12 and the second hard mask structure 906 of FIG. 12 are selectively removed by a fourth etching process 1302. The fourth etching process 1302 is a wet etch that may, for example, include an etchant such as phosphoric acid, HF, DHF, BHF, buffered oxide, hydrochloric acid, a silicon etchant, a combination thereof, or other etchants. The fourth etching process 1302 exposes a top surface of the mask 120 between a first curved portion 114c1 of the sidewall spacer 114. The third etching process of FIG. 12 and the fourth etching process 1302 forms sidewall spacer 114 with first curved portion 114c1 extending along a top surface of the mask. A second curved portion 114c2 of the sidewall spacer 114 that extends from an outer edge of the data storage structure 110 to past an outer edge of the top electrode 112. The first curved portion 114c1 is separated from the second curved portion 114c2 by a first substantially vertical portion 114s1 of the sidewall spacer 114. The second curved portion 114c2 and the first substantially vertical portion 114s1 overlies the mask. A second substantially vertical portion 114s2 of the sidewall spacer 114 extends from the second curved portion 114c2 of the sidewall spacer 114 above the mask 120 to the data storage structure 110. As such, the sidewall spacer 114 is defined by a horn shape that enhances reliability of memory device 130.

Figure 14:
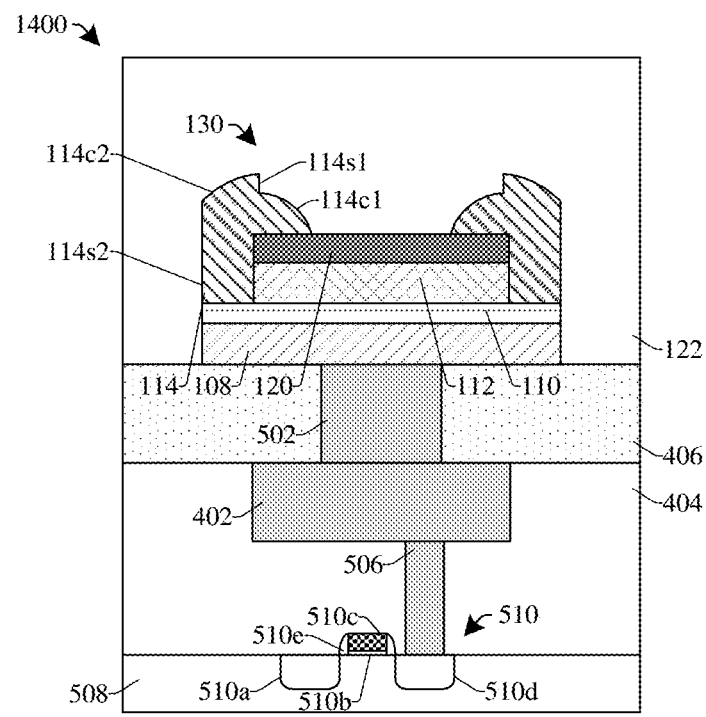

As shown in cross-sectional view 1400 of FIG. 14, an upper dielectric structure 122 is formed.

The upper dielectric structure 122 is formed over memory device 130, the sidewall spacer 114, and middle dielectric structure 406. In some embodiments, the upper dielectric structure 122 may be formed by a deposition process (e.g., PVD, CVD, PE-CVD, ALD, or the like). In various embodiments, the upper dielectric structure 122 may comprise silicon dioxide (e.g., $SiO_2$), doped silicon dioxide (e.g., carbon doped silicon dioxide), silicon oxynitride (e.g., $N_2OSi_2$), BSG, PSG, BPSG, FSG, a porous dielectric material, or the like.

Figure 15:
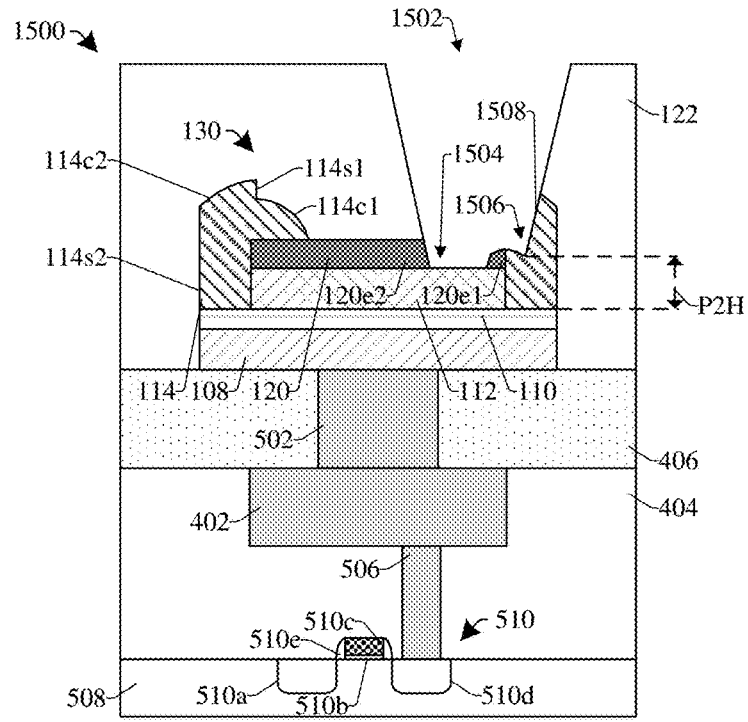

As shown in cross-sectional view 1500 of FIG. 15, a TEVA opening 1502 is formed in the upper dielectric structure 122.

The upper dielectric structure 122 is etched according to a patterned mask (not shown) to form TEVA opening 1502. The TEVA opening 1502 is formed with a registration error where the TEVA opening 1502 misaligned with respect to a center of memory device 130, where TEVA opening 1502 overlies memory device 130 and is also aligned over the sidewall spacer 114. TEVA opening 1502 exposes an inner sidewall 1508 of the sidewall spacer 114 and an upper surface of the sidewall spacer 114. TEVA opening 1502 further exposes the top electrode 112, sidewalls of mask 120, and an upper surface of mask 120.

The etch that forms TEVA opening 1502 separates a first edge portion 120e1 of mask 120 from a second edge portion 120e2 of mask 120. Furthermore, TEVA opening 1502 is formed with a first lower opening protrusion 1504 over the top electrode 112 and a second lower opening protrusion 1506 overlying the sidewall spacer 114. A lowest edge height P2H of the second lower opening protrusion 1506 above the data storage structure 110 is greater than a thickness of the top electrode 112. Thus, sidewall spacer 114 separates the second lower opening protrusion 1506 from the bottom electrode 108. As such, the sidewall spacer 114 prevents TEVA opening 1502 from extending to the bottom electrode 108 when TEVA opening 1502 is formed with a registration error.

Figure 16:
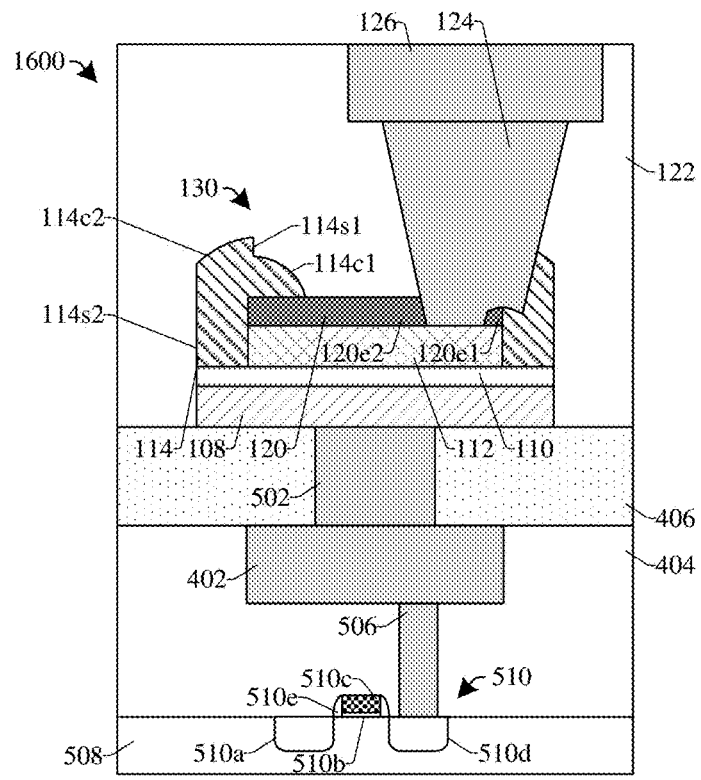

As shown in cross-sectional view 1600 of FIG. 16, a TEVA 124 is formed in TEVA opening 1502, and an upper metal feature 126 is formed over the TEVA 124.

TEVA 124 is formed with a suitable deposition process (e.g., PVD, CVD, PE-CVD, ALD, sputtering, or the like). The upper dielectric structure 122 is extended by deposition, and an upper metal feature 126 is formed within the upper dielectric structure 122. The upper metal feature 126 may be formed by selectively etching the upper dielectric structure 122 to define an opening within the upper dielectric structure, and forming a conductive material within the opening. The TEVA 124 and upper metal feature 126 may, for example, be or comprise copper, tungsten, aluminum, some other suitable material(s), or any combination of the foregoing.

The TEVA 124 is formed protruding through mask 120 and electrically coupled to the top electrode 112. Furthermore, the bottom surface of the TEVA 124 aligned directly over the sidewall spacer 114 is separated from the bottom electrode by the sidewall spacer.

The sidewall spacer 114 is defined by a horn shape that enhances reliability of the memory device 130. By forming the second substantially vertical portion 114s2 of the sidewall spacer to extend above the mask 120, an etch rate through the sidewall spacer will prevents the TEVA 124 from extending past the top electrode 112 and shorting to the bottom electrode 108 in the presence of the registration error. By forming the first curved portion 114c1 and second curved portion 114c2 of the sidewall spacer to overlap with the top electrode 112, via drawback is mitigated, and the TEVA 124 is prevented from shorting to the bottom electrode 108 when a registration error occurs. As a result of the horn shape of the sidewall spacer 114, the second lower surface 124s2 of the TEVA 124 is decoupled from the bottom electrode 108 by the sidewall spacer 114. Thus, read/write operations of memory device 130, initiated by access device 510, are conducted with improved reliability in the presence of a TEVA 124 formed with a registration error.

Figure 17:
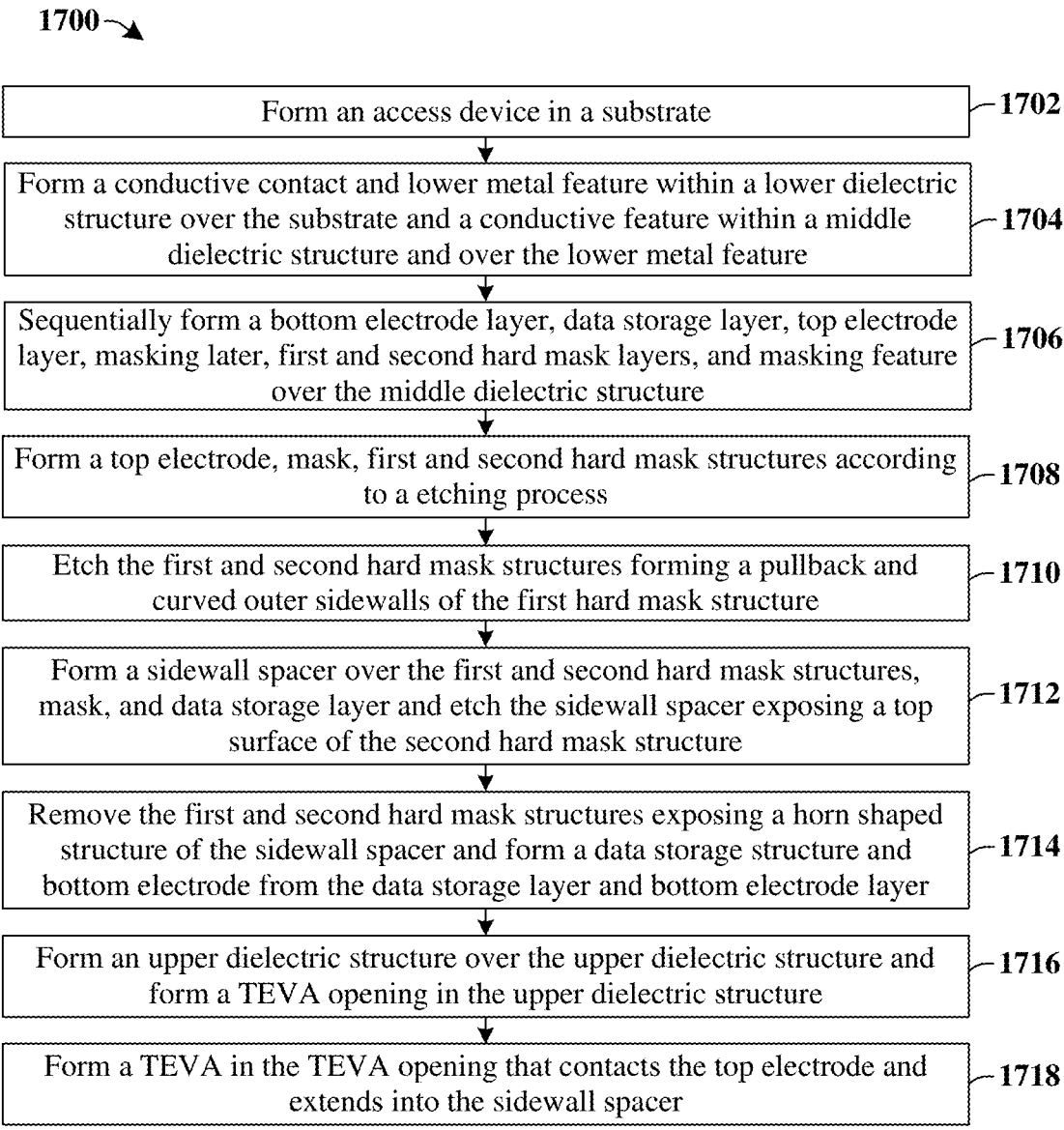
FIG. 17 illustrates a flow diagram of some embodiments of the method of FIGS. 6-16.

FIG. 17 illustrates a flow diagram of some embodiments 1700 of the method of FIGS. 6-16. While FIG. 17 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, an access device is formed within a substrate. FIG. 6 illustrates a cross-sectional view 600 of some embodiments corresponding to act 1702.

At 1704, a conductive contact and a lower metal feature are formed within a lower dielectric structure over the substrate, and a conductive feature is formed within a middle dielectric structure and over the lower metal feature. FIG. 7 illustrates a cross-sectional view 700 of some embodiments corresponding to act 1704.

At 1706, a bottom electrode layer, a data storage layer, a top electrode layer, a masking layer, a first hard mask layer, a second hard mask layer, and a masking feature are sequentially formed over the middle dielectric structure. FIG. 8 illustrates a cross-sectional view 800 of some embodiments corresponding to act 1706.

At 1708, a top electrode, mask, first and second hard mask structures are formed from the top electrode layer, masking layer, and first and second hard mask layers according to an etching process. The first and second hard mask layers are formed with differing etch rates where the first hard mask layer has a faster etch rate than the second hard mask layer. FIG. 9 illustrates a cross-sectional view 900 of some embodiments corresponding to act 1708.

At 1710, the first and second hard mask structures are selectively wet etched forming a pullback of the first and second hard mask structures and curved outer sidewalls of the first hard mask structure. The first hard mask structure is etched more than the second hard mask structure due to the faster etch rate of the first hard mask structure. FIG. 10 illustrates a cross-sectional view 1000 of some embodiments corresponding to act 1710.

At 1712, a sidewall spacer layer is formed over the first and second hard mask structures, the mask, and data storage layer and the sidewall spacer is etched exposing a top surface of the second hard mask structure. FIGS. 11-12 illustrates cross-sectional views 1100-1200 of some embodiments corresponding to act 1712.

At 1714, remove the first and second hard mask structures exposing a horn shaped structure of the sidewall spacer, and form a data storage structure and bottom electrode from the data storage layer and bottom electrode layer. FIG. 13 illustrates a cross-sectional view 1300 of some embodiments corresponding to act 1714.

At 1716, form an upper dielectric structure over the sidewall spacer and middle dielectric structure, and form a TEVA opening in the upper dielectric structure. FIGS. 14-15 illustrates cross-sectional views 1400-1500 of some embodiments corresponding to act 1716.

At 1718, form a TEVA in the TEVA opening that contacts the top electrode and extends into the sidewall spacer. FIG. 16 illustrates a cross-sectional view 1600 of some embodiments corresponding to act 1718.

Accordingly, in some embodiments, the present disclosure relates to a method of forming a semiconductor structure having a memory device with a sidewall spacer comprising a horn shaped structure that isolates a TEVA coupled to a top electrode from coupling to a bottom electrode.

In various embodiments, the present application provides a memory device comprising bottom electrode; a data storage structure overlying the bottom electrode; a top electrode overlying the data storage structure; a mask overlying the top electrode; a sidewall spacer extending alongside the data storage structure and alongside the mask, the sidewall spacer extending to a height above an upper surface of the mask; and a top electrode via (TEVA) extending through the mask to the top electrode and extending into the sidewall spacer, wherein a first curved portion of the sidewall spacer extends along a top surface of the mask and is spaced apart from the TEVA.

In various embodiments, the present application provides a semiconductor structure comprising: a memory device comprising a bottom electrode separated from a top electrode by a data storage structure; a mask disposed over the top electrode; a sidewall spacer extending along edges of the top electrode and mask, wherein an inner sidewall of the sidewall spacer meets an outer sidewall of the mask at an interface; a top electrode via (TEVA) body disposed over the top electrode and directly overlying the interface, the TEVA body having tapered outer sidewalls; and a first TEVA protrusion extending from a lower portion of the TEVA body, through the mask, and to an upper surface of the top electrode, wherein the first TEVA protrusion is spaced apart from the interface and the sidewall spacer by a first edge portion of the mask.

In various embodiments, the present application provides a method of forming a memory device, comprising: forming a bottom electrode layer; forming a data storage layer overlying the bottom electrode layer; forming a top electrode layer overlying the data storage layer; forming a masking layer overlying the top electrode layer; subsequently forming a first hard mask layer and a second hard mask layer over the masking layer; patterning the first hard mask layer, the second hard mask layer, the masking layer, and the top electrode layer to form a top electrode and a mask overlying the top electrode; and performing an etching process on the first hard mask layer and the second hard mask layer to form a second hard mask structure separated from the mask by a first hard mask structure, wherein during the etching process, an etch rate of the first hard mask layer is higher than an etch rate of the second hard mask layer, and wherein a width of the first hard mask structure is less than a width of the second hard mask structure, and exposing a top surface of the mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
forming a bottom electrode layer;
forming a data storage layer overlying the bottom electrode layer;
forming a top electrode layer overlying the data storage layer;
forming a masking layer overlying the top electrode layer;
subsequently forming a first hard mask layer and a second hard mask layer over the masking layer;
patterning the first hard mask layer, the second hard mask layer, the masking layer, and the top electrode layer to form a top electrode and a mask overlying the top electrode; and
performing an etching process on the first hard mask layer and the second hard mask layer to form a second hard mask structure separated from the mask by a first hard mask structure, wherein during the etching process, an etch rate of the first hard mask layer is higher than an etch rate of the second hard mask layer, and wherein a width of the first hard mask structure is less than a width of the second hard mask structure, and exposing a top surface of the mask.

2. The method according to claim 1, further comprising:
depositing a sidewall spacer along an exposed top surface of the mask and along the first and second hard mask structures.

3. The method according to claim 1, further comprising:
performing a surface treatment on the first hard mask layer forming a density gradient in the first hard mask layer where a bottom surface of the first hard mask layer has a lower density relative to a top surface of the first hard mask layer.

4. The method of claim 2, further comprising:
removing the first hard mask layer and the second hard mask layer exposing a portion of the mask between inner sidewalls of the sidewall spacer; and
performing an etching process forming a top electrode via (TEVA) opening laterally offset from a center of the mask, wherein the TEVA opening is formed with a first lower opening protrusion extending through the mask and exposing a top surface of the top electrode, and wherein the TEVA opening is formed with a second lower opening protrusion aligned over the sidewall spacer.

5. The method of claim 4, wherein the second lower opening protrusion is formed elevated above the first lower opening protrusion.

6. The method of claim 4, wherein the first lower opening protrusion is formed separated from the second lower opening protrusion by a first edge portion of the mask and a portion of the sidewall spacer.

7. The method of claim 6, wherein the etching process forming the TEVA opening also forms a second edge portion of the mask separated from the first edge portion of the mask by the first lower opening protrusion.

8. The method of claim 7, wherein a width of the second edge portion of the mask is formed greater than a width of the first edge portion of the mask.

9. The method of claim 4, further comprising depositing a conductive material within the TEVA opening forming a TEVA that contacts the mask, the top electrode, and the sidewall spacer.

10. A method of forming a semiconductor structure, the method comprising:
   forming a bottom electrode;
   forming a data storage structure on the bottom electrode;
   forming a top electrode on the data storage structure;
   forming a mask on the top electrode;
   forming a sidewall spacer extending along edges of the top electrode and mask, wherein the sidewall spacer meets an outer sidewall of the mask at an interface; and
   forming a top electrode via (TEVA) directly over the interface, wherein the top electrode via is formed with:
      a first TEVA protrusion extending through the mask to an upper surface of the top electrode, wherein the first TEVA protrusion is spaced apart from the interface by a first edge portion of the mask.

11. The method of claim 10, wherein the sidewall spacer is formed with a first curved portion extending on a second edge portion of the mask opposite the first edge portion of the mask.

12. The method of claim 11, wherein the sidewall spacer is formed with a second curved portion above the first curved portion.

13. The method of claim 12, wherein the sidewall spacer is formed with a first substantially vertical portion that connects the first curved portion to the second curved portion.

14. The method of claim 10, wherein the TEVA is formed with a second TEVA protrusion extending from the TEVA, wherein the second TEVA protrusion is formed with a lowermost edge that is disposed in the sidewall spacer.

15. The method of claim 10, wherein the TEVA is formed with a central axis of the TEVA offset from a central axis of the top electrode.

16. The method of claim 10, wherein the mask is formed with a second edge portion, wherein the first edge portion of the mask is formed below a top surface of the second edge portion of the mask.

17. The method of claim 10, wherein a bottom surface of the TEVA is formed between innermost edges of the sidewall spacer.

18. A method of forming a semiconductor structure, the method comprising:
   forming a memory device comprising a bottom electrode separated from a top electrode by a data storage structure;
   forming a mask on the top electrode; and
   forming a sidewall spacer along outer sidewalls of the top electrode and the mask, wherein on a first side of the mask and the top electrode, the sidewall spacer is formed with:
      a first curved portion on a top surface of the mask;
      a second curved portion above the first curved portion;
      a first vertical portion extending from the first curved portion to the second curved portion; and
      a second vertical portion extending from the second curved portion to a bottom surface of the sidewall spacer.

19. The method of claim 18, wherein the method further comprises; on a second side of the mask and the top electrode that is opposite the first side of the mask and the top electrode:
   forming a top electrode via (TEVA) that extends into the mask and the sidewall spacer, wherein the TEVA separates an inner edge of the sidewall spacer from an uppermost surface of the mask.

20. The method of claim 19, wherein the method further comprises forming the TEVA straddling a lower portion of the mask and the sidewall spacer.

* * * * *